(12) United States Patent
D'Angelo

(10) Patent No.: US 8,829,873 B2
(45) Date of Patent: Sep. 9, 2014

(54) STEP DOWN CURRENT MIRROR FOR DC/DC BOOST CONVERTERS

(75) Inventor: Kevin D'Angelo, Santa Clara, CA (US)

(73) Assignee: Advanced Analogic Technologies Incorporated, Santa Clara, CA (US)

(*) Notice: Subject to any disclaimer, the term of this patent is extended or adjusted under 35 U.S.C. 154(b) by 660 days.

(21) Appl. No.: 13/080,115

(22) Filed: Apr. 5, 2011

(65) Prior Publication Data

US 2012/0256610 A1    Oct. 11, 2012

(51) Int. Cl.
*G05F 1/00* (2006.01)
*G05F 3/26* (2006.01)

(52) U.S. Cl.
CPC ........................ *G05F 3/262* (2013.01)
USPC ........................................... 323/282

(58) Field of Classification Search
CPC .................... G05F 3/16; G05F 3/262
USPC ............... 323/222, 225, 268, 271, 282, 285
See application file for complete search history.

(56) References Cited

U.S. PATENT DOCUMENTS

| 6,448,750 B1* | 9/2002 | Shor et al. ................ 323/282 |
| 7,557,558 B2* | 7/2009 | Barrow ..................... 323/316 |
| 7,636,014 B1* | 12/2009 | Chen ........................ 330/254 |

* cited by examiner

*Primary Examiner* — Matthew Nguyen
(74) *Attorney, Agent, or Firm* — Lando & Anastasi, LLP

(57) ABSTRACT

A low voltage current mirror design is used to control a high voltage boost converter. A high amperage reference current emanating from a high voltage inductor based DC-to-DC boost converter is mirrored to a low amperage output current. On-chip CMOS elements are used to measure and manipulate the output current, eliminating the need for a high precision, low resistance, external resistor. The measured and manipulated current is used to control the PWM duty cycle of an inductor based DC-to-DC boost converter, allowing for a lower cost solution in a high voltage, high current situation.

20 Claims, 4 Drawing Sheets

STEP DOWN CURRENT MIRROR FOR DC/DC BOOST CONVERTERS

BACKGROUND OF THE INVENTION

One method used in modern, inductor based DC/DC boost converters to control the switching of power through the inductor utilizes a high current, low resistance, precision resistor. The resistor, shown in FIG. 1 as $R_{sense}$, is used to measure the current flowing through the inductor as the inductor is charging. The inclusion of this off-chip resistor as part of the DC/DC boost converter can be a significant part of the cost of the boost converter circuitry, and increases system complexity by imposing off-chip requirements on the manufacturer of the appliance rather than the more knowledgeable fabricator of the boost converter itself.

Generally, this precision resistor is not included as part of the integrated circuit that controls the converter. The low impedance of the resistor (in the neighborhood of 50 milliohms) makes its inclusion in such a chip problematic, as chip fabricators have difficulty fabricating a low resistance device with a high degree of required precision. The same requirement for precision also makes the installation of $R_{sense}$ into the enclosing appliance difficult, as careful traces are required in order to avoid instability in the DC/DC converter. As a result of these factors, the cost of both the resistor itself and assembling the resistor into the final product (the television that contains the DC/DC converter, for example) is high.

In addition, this topology often requires the appliance manufacturer to make use of a low pass filter to screen out the noise produced by the MOSFET (shown in FIG. 1 as $S_1$) as $S_1$ opens and closes. Without such filtering, the noise from the MOSFET can make it difficult to accurately read (and then process) the voltage across $R_{sense}$. With the added requirement of such filtering, there is additional cost in both the elements of the low pass filter and the careful assembly of these elements onto the circuit board of the appliance.

In addition, the use of the off-chip resistor requires the chip fabricator to execute modifications to compensate for any remaining noise within the PWM control loop. This becomes more problematic when it is understood that the in-circuit compensation is for an external element of the DC/DC converter circuitry, said element installed by the appliance manufacturer rather than the chip fabricator. These additional frequency components add design complexity and design cost to the boost converter circuitry.

While it is technically possible to put $S_1$ on the same substrate as the rest of the components, this is generally impractical because of its high voltage requirement and low resistance rating. The inclusion of this resultantly large switch within the same substrate as the remaining boost converter components would result in a higher cost per unit that can outweigh all of the other costs outlined previously. It is possible to package $S_1$ and the remaining components—manufactured on different substrates—in the same package, but this too is of negligible added benefit and would impose otherwise absent restrictions on the appliance manufacturer.

SUMMARY OF THE INVENTION

The invention eliminates the need for an off chip, low resistance, high precision resistor used to sense current in high voltage boost converters. The circuit uses a current mirror to proportionally reduce the large current that runs through the switching MOSFET of a boost converter to a smaller current. This smaller current can then be manipulated in any one of a number of ways that can be implemented within a typical lower voltage CMOS process. For example, the smaller current can be measured with a higher resistance CMOS resistor included within a typical integrated circuit. The ability to trim these high resistance resistors during the manufacturing process allows for a high degree of precision in the final DC/DC converter integrated circuit. A refinement of that embodiment would involve a second current mirror, allowing the reference resistor to be referenced to ground.

In another embodiment, the actual current itself could be used, compared to the output of an "error operational transconductance amplifier" rather than the more standard operational amplifier. In this instance, the summation of these two currents could be used directly as the input to an oscillator that drives the MOSFET.

In addition, the invention's topology no longer requires that the voltage be measured on the high current connection immediately below the MOSFET. Because of this change, the MOSFET noise becomes less problematic, allowing for the elimination of the low pass (or other) noise filter. This lowers the appliance manufacturer's cost by eliminating the filter components and reducing the complexity of board fabrication.

The new topology is accurate because it is based on a ratio of two differently sized MOSFETs: a large MOSFET through which passes the reference current—the large inductor current—and a smaller MOSFET that determines the size of the output current. As a result, the ratio tracks over manufacturing process and appliance temperature variations, as both MOSFETs are created by the same instance of the manufacturing process and then used equivalently with the same wiring scheme and the identical gate voltages.

DETAILED DESCRIPTION OF THE PREFERRED EMBODIMENTS

Figure 1:
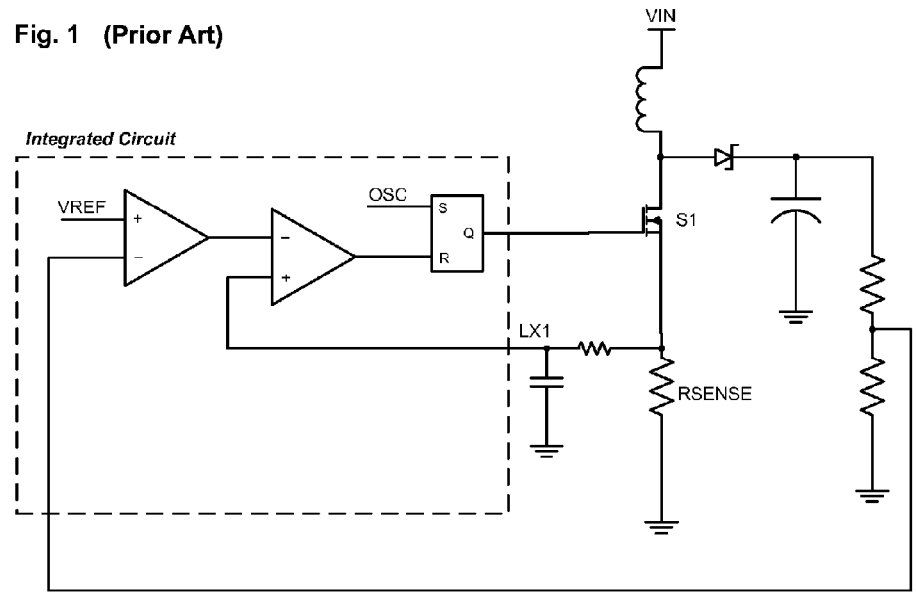
FIG. 1 is a schematic of a prior art boost converter with an external sense resistor.
Figure 2:
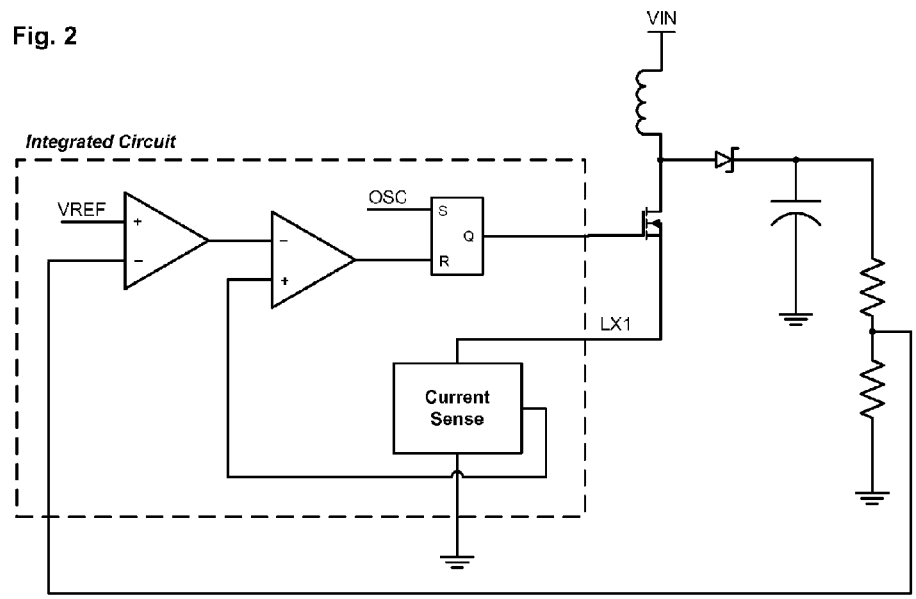
FIG. 2 is a schematic of a boost converter utilizing the integrated current sense invention.
Figure 3:
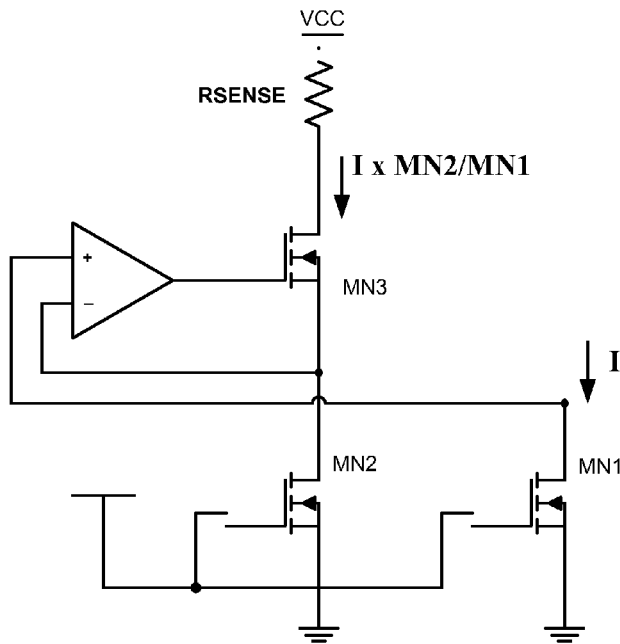
FIG. 3 is a schematic of the invention utilizing a current mirror and an integrated sense resistor.

FIG. 3 shows the construction of one embodiment of the invention as a combination of a current mirror and an integrated sense resistor. In many current mirror applications, the object is one of multiplying a desired current upward—using a small current to drive a large current. Here, the goal is the reverse—the invention uses a large current to derive a small current. In this example, noting that the voltages applied to the gates of the MOSFETs MN1 and MN2 are the same, and that the operational amplifier ensures that the voltages across the drains of MN1 and MN2 are also equivalent, the ratio of the currents through the MN1 and MN2 is simply a ratio of the sizes of MN1 and MN2 to each other, where the size of each is its width divided by its length.

In this current mirror, the operational amplifier finds the correct current through MN2 by altering the gate voltage of MN3. When the correct gate voltage of MN3 is found such that the voltages above MN1 and MN2 are equivalent, the size of the output current can be found by measuring the voltage across the known resistor $R_{sense}$.

Figure 4:
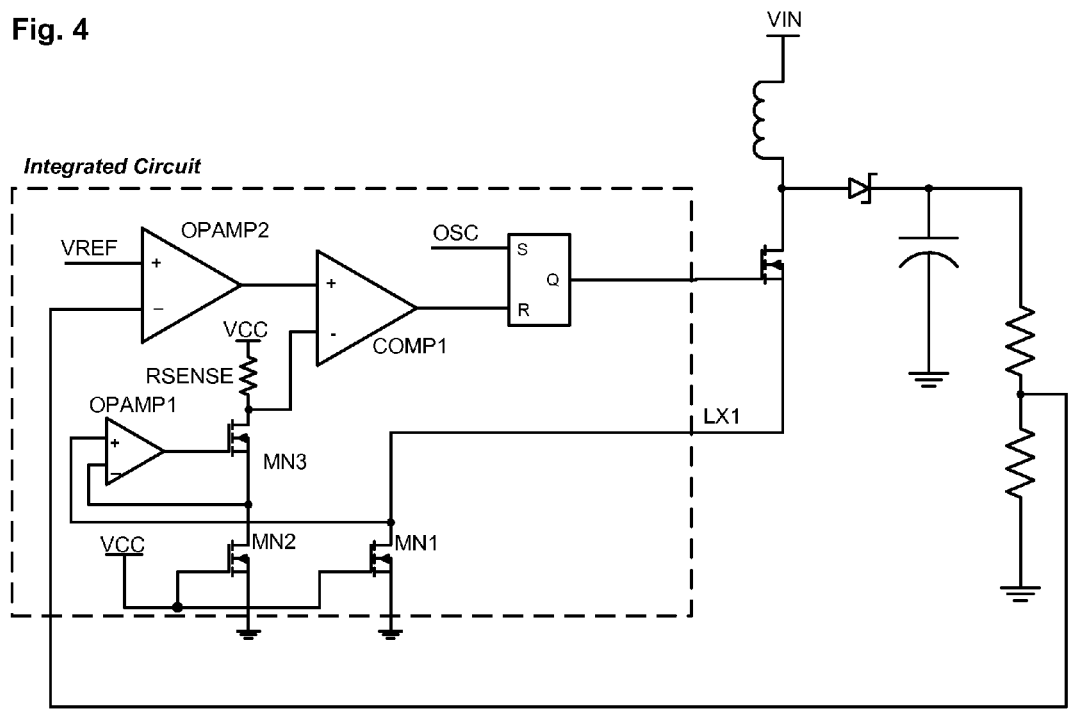
FIG. 4 is a schematic of an embodiment of the invention integrated into a boost converter.

FIG. 4 shows the inclusion of the integrated sense resistor circuit into the larger circuit of a boost converter. This figure shows the original location of $R_{sense}$, with its voltage referenced to a voltage source. An alternate circuit would change the resistor's reference from the voltage source to ground by utilizing the alternate embodiment (with the second current mirror) described above.

Figure 5:
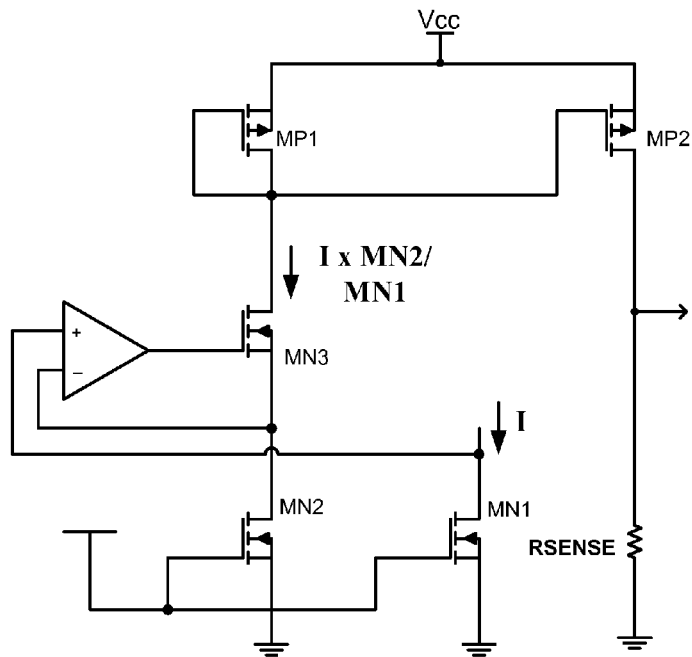
FIG. 5 is a schematic of a second embodiment of the invention using a second current mirror.

One inconvenience with this first embodiment of the invention is that the voltage across $R_{sense}$ is not referenced to ground; rather, it is referenced to a voltage source. This inconvenience can be alleviated with the addition of a second current mirror, shown in FIG. 5. This simpler current mirror reflects the "first produced" current (shown as I×MN2/MN1) into a "second produced" current that flows through a relocated $R_{sense}$ resistor that is referenced to ground. Other than the difference voltage references, the two circuits function similarly.

Figure 6:
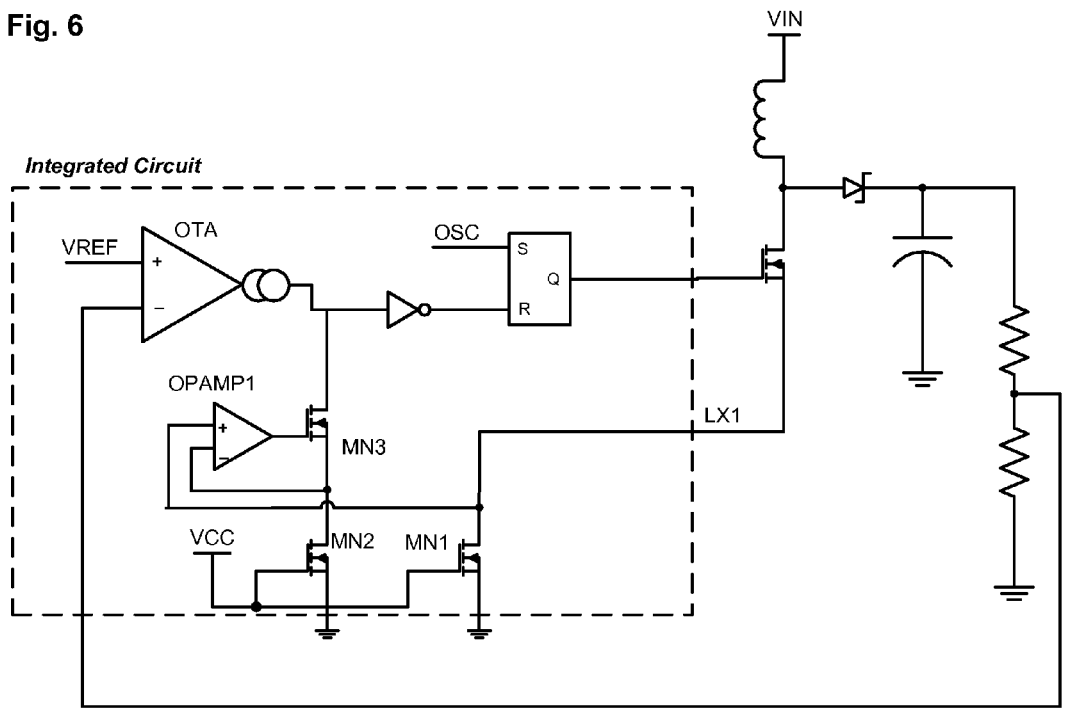
FIG. 6 (MISSING) is a schematic of a third embodiment of the invention using an operational transconductance amplifier.

Another embodiment of the invention utilizes directly the output current of the current mirror. Consider a boost converter in which the error element is an operational transconductance amplifier rather than the more standard operational amplifier. In this instance, the summation of the two currents—one from the OTA and the other from the current mirror—could be used directly as the input to an oscillator that drives the MOSFET. FIG. 6 shows how this current summation methodology could be implemented inside of a boost converter.

Figure 7:
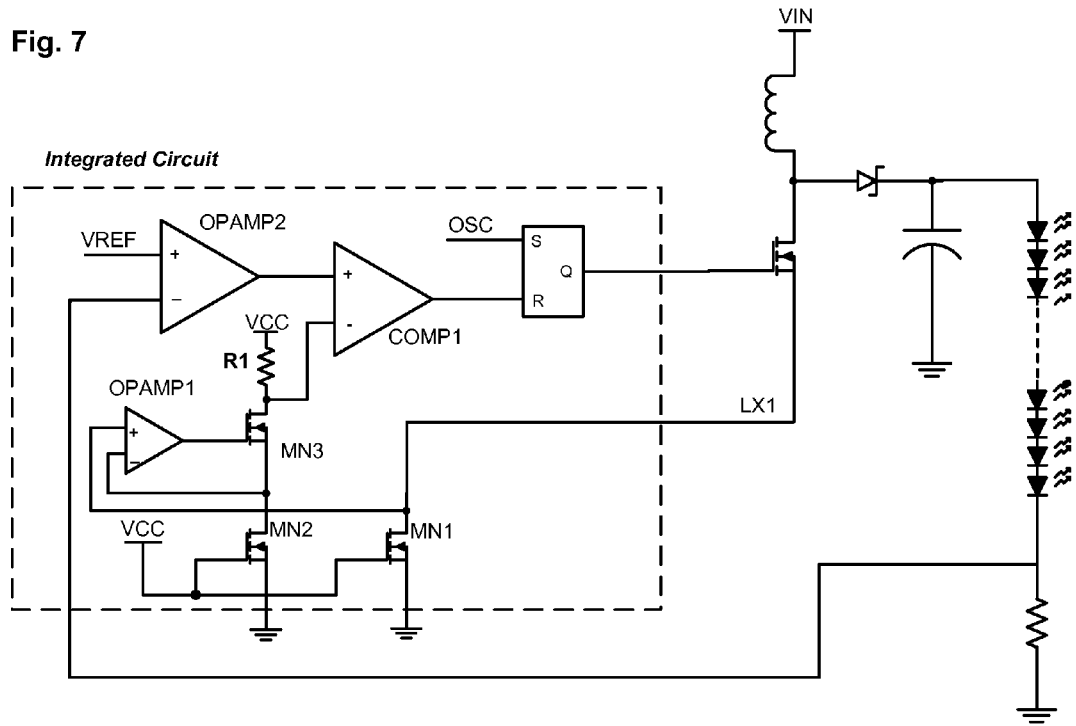
FIG. 7 is a schematic of an embodiment of the invention driving a single string of LEDs.

FIG. 7 shows an embodiment of the invention as it would appear in an enclosing appliance, in this case a small screen as part of a laptop computer. The screen is composed of 1 string of 10 LEDs. The 10 LED segment would have a forward voltage of about 35 volts. Each LED requires about 0.1 amps to produce the correct amount and color of light, implying that the resistor at the front of the LED string to ground sees about 0.1 amps. If we want an ideal measurement across the resistor to be 1.2 volts, the resistance is then imputed using R=V/I, or 12 ohms.

Figure 8:
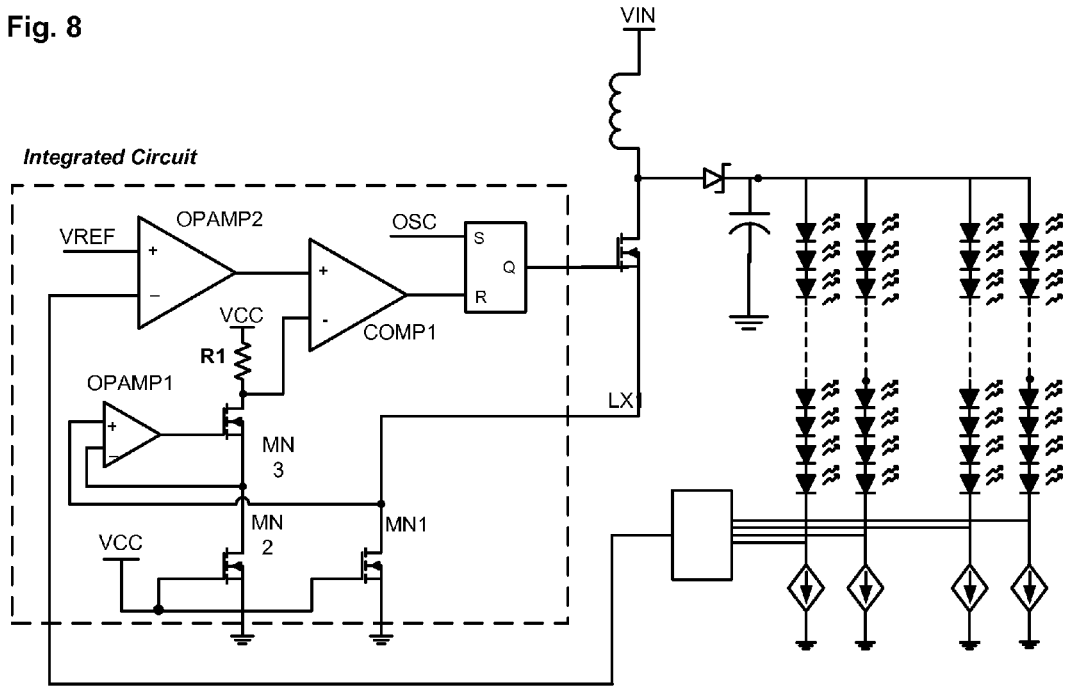
FIG. 8 is a schematic of an embodiment of the invention driving multiple strings of LEDs.

FIG. 8 shows a second embodiment of the invention as it would appear in a more complex appliance—a television with an LED backlight. In this example, the individual strings of LEDs (there could be multiple dozens of strings, or even more) are each controlled by individual current sinks. (The current sinks are controlled by a separate controller part of the television.) In order for the current sinks to function, they must have access to 1.2 volts. The black box in the drawing, which may be one IC or a series of ICs, takes as inputs the voltages above the current sinks and returns the single lowest voltage as its output, ensuring enough current for all of the strings by ensuring a minimal voltage across each of the current sinks.

What is claimed is:

1. An integrated circuit for controlling a boost converter that includes an inductor coupled to a drain of a switching MOSFET, the integrated circuit comprising:
   a gate pin to couple to a gate of the switching MOSFET;
   a source pin to couple to a source of the switching MOSFET;
   a feedback pin;
   a first current mirror sub-circuit, the first current mirror sub-circuit configured to produce an output current from a reference current flowing between the source pin and ground, the reference current being larger than the output current; and
   a dc-to-dc-control sub-circuit connected to the first current mirror sub-circuit, the dc-to-dc control sub-circuit configured to control a voltage on the gate pin in order to maintain a voltage on the feedback pin.

2. The integrated circuit of claim 1 wherein the dc-to-dc control sub-circuit includes a resistor through which the output current from the first current mirror sub-circuit flows and the connection of the dc-to-dc-control sub-circuit to the current mirror sub-circuit utilizes a voltage across the resistor.

3. The integrated circuit of claim 2 wherein the dc-to-dc control sub-circuit further includes:
   an operational amplifier having a first input connected to a reference voltage and a second input connected to the feedback pin; and
   a comparator having a first input connected to the output of the operational amplifier and a second input connected to the voltage across the resistor.

4. An integrated circuit for controlling a boost converter, the integrated circuit comprising:
   a gate pin;
   a source pin;
   a feedback pin;
   a first current mirror sub-circuit, the first current mirror sub-circuit configured to produce a first output current from a first reference current flowing between the source pin and ground, the first reference current being larger than the first output current;
   a dc-to-dc-control sub-circuit connected to the first current mirror sub-circuit, the dc-to-dc control sub-circuit configured to control a voltage on the gate pin in order to maintain a voltage on the feedback pin; and
   a second current mirror sub-circuit configured to produce a second output current from a second reference current, the second reference current being the first output current of the first current mirror sub-circuit and the dc-to-dc-control sub-circuit being connected to the second current mirror sub-circuit.

5. The integrated circuit of claim 4 wherein the dc-to-dc control sub-circuit includes a resistor through which the second output current from the second current mirror sub-circuit flows and the connection of the dc-to-dc-control sub-circuit to the second current mirror sub-circuit utilizes the voltage across the resistor.

6. The integrated circuit of claim 5 wherein the dc-to-dc control sub-circuit further includes:
   an operational amplifier having a first input connected to a reference voltage and a second input connected to the feedback pin; and
   a comparator having a first input connected to an output of the operational amplifier and a second input connected to the voltage across the resistor.

7. The integrated circuit of claim 1 wherein the dc-to-dc control sub-circuit includes an operational transconductance amplifier having a first input connected to a reference voltage and a second input connected to the feedback pin, the operational transconductance amplifier being configured to output a variable current based on a difference between voltages at the first and second inputs, the connection of the dc-to-dc-control sub-circuit to the first current mirror sub-circuit of summing the output current of the first current mirror sub-circuit and the variable current of the operational transconductance amplifier.

8. A circuit configured as a boost converter comprising:
an inductor;
a MOSFET, coupled to the inductor, that switches an inductor current of the inductor from a charging state to a discharging state, and vice versa;
a first current mirror sub-circuit, the first current mirror sub-circuit being fabricated on a different substrate than the MOSFET and configured to produce a first output current from a reference current flowing through the MOSFET while the inductor is charging, the reference current being larger than the first output current, the circuit being configured to utilize the first output current of the first current mirror sub-circuit in the switching of the MOSFET.

9. The circuit of claim 8 further comprising:
a resistor through which the first output current from the first current mirror sub-circuit flows, the resistor being fabricated on the same substrate as the first current mirror sub-circuit, the circuit utilizing the first output current of the first current mirror sub-circuit to develop a voltage across the resistor to control the switching of the MOSFET.

10. The circuit of claim 9 further comprising:
an operational amplifier having an input connected to a reference voltage; and
a comparator having a first input connected to an output of the operational amplifier and a second input connected to the voltage across the resistor.

11. The circuit of claim 8 further comprising:
a second current mirror sub-circuit fabricated on the same substrate as the first current mirror sub-circuit and configured to produce a second output current from the first output current of the first current mirror sub-circuit, the circuit utilizing the first output current of the first current mirror sub-circuit to generate the second output current of the second current mirror sub-circuit to control the switching of the MOSFET.

12. The circuit of claim 11 further comprising:
a resistor through which the second output current from the second current mirror sub-circuit flows, the resistor being fabricated on the same substrate as the second current mirror sub-circuit, the circuit utilizing the second output current of the second current mirror sub-circuit to develop a voltage across the resistor to control the switching of the MOSFET.

13. The circuit of claim 12 further comprising:
an operational amplifier having one input connected to a reference voltage; and
a comparator having a first input connected to an output of the operational amplifier and a second input connected to the voltage across the resistor.

14. The circuit of claim 8 further comprising:
an operational transconductance amplifier having a first input connected to a reference voltage and a second input connected to the feedback pin, the operational transconductance amplifier being configured to output a variable current based on a difference between voltages at the first and second inputs,
the circuit being configured to utilize the first output current of the first current mirror sub-circuit by summing the first output current of the first current mirror sub-circuit and the variable output current of the operational transconductance amplifier.

15. A method of regulating an output voltage of a DC-to-DC boost converter that includes an inductor coupled to a MOSFET, the method comprising:
mirroring, by a first current mirror sub-circuit fabricated on a different substrate than a substrate on which the MOSFET is fabricated, the current flowing through the inductor as the inductor is charging to a smaller output current; and
switching, utilizing the output current of the first current mirror sub-circuit, the MOSFET to alternately charge and discharge the inductor.

16. The method of claim 15 further comprising:
converting the output current of the first current mirror sub-circuit to a voltage using a resistor fabricated on the different substrate.

17. The method of claim 15 further comprising:
converting the output current of the first current mirror sub-circuit to an output current of a second current mirror sub-circuit, the second current mirror sub-circuit being fabricated on the different substrate; and
utilizing the output current of the second current mirror sub-circuit.

18. The method of claim 17 further comprising:
converting the output current of the second current mirror sub-circuit to a voltage using a resistor fabricated on the different substrate.

19. The method of claim 15 further comprising:
summing the output current from the first current mirror sub-circuit with the output current from an operational transconductance amplifier; and
switching, utilizing a summed output current of the first current mirror sub-circuit and the output current from the operation transconductance amplifier, the MOSFET to alternately charge and discharge the inductor.

20. The integrated circuit of claim 1 further comprising a plurality of series connected LEDs coupled between the drain of the switching MOSFET and ground.

* * * * *

UNITED STATES PATENT AND TRADEMARK OFFICE
CERTIFICATE OF CORRECTION

| | | |
|---|---|---|
| PATENT NO. | : 8,829,873 B2 | Page 1 of 1 |
| APPLICATION NO. | : 13/080115 | |
| DATED | : September 9, 2014 | |
| INVENTOR(S) | : Kevin D'Angelo | |

It is certified that error appears in the above-identified patent and that said Letters Patent is hereby corrected as shown below:

In the Specification:

Column 2, Line 46, delete "(MISSING)".

In the Claims:

Column 4, Line 64, delete "of".

Signed and Sealed this
Tenth Day of March, 2015

Michelle K. Lee
*Deputy Director of the United States Patent and Trademark Office*